United States Patent
Barron et al.

(10) Patent No.: US 9,910,467 B2
(45) Date of Patent: Mar. 6, 2018

(54) LID AND POWER SUPPLY INTERLOCK MECHANISM

(71) Applicant: International Business Machines Corporation, Armonk, NY (US)

(72) Inventors: David Barron, Austin, TX (US); Matthew T. Richardson, Austin, TX (US); Steven L. Schwark, Rancho Santa Margarita, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/701,761

(22) Filed: May 1, 2015

(65) Prior Publication Data
US 2016/0324024 A1 Nov. 3, 2016

(51) Int. Cl.
H05K 7/14 (2006.01)
G06F 1/18 (2006.01)
H05K 5/02 (2006.01)

(52) U.S. Cl.
CPC ........... *G06F 1/188* (2013.01); *H05K 5/0208* (2013.01); *H05K 7/1487* (2013.01); *H05K 7/1492* (2013.01)

(58) Field of Classification Search
CPC .......... G06F 21/86; G06F 1/181; G06F 1/189; G06F 1/182; G06F 1/188; G06F 21/88; H05K 5/0221; H05K 5/0239; H05K 5/0208; H05K 7/1487; H05K 7/1492
USPC ... 361/725–728, 747, 752, 759, 679.58, 724
See application file for complete search history.

(56) References Cited

U.S. PATENT DOCUMENTS

| | | | |
|---|---|---|---|
| 4,582,381 A * | 4/1986 | Bisczat | B41J 29/387 439/296 |
| 5,821,641 A | 10/1998 | Demo et al. | |
| 6,044,551 A | 4/2000 | Jarrett | |
| 6,293,828 B1 * | 9/2001 | Colver | H05K 7/1457 439/680 |
| 6,367,896 B1 | 4/2002 | Peng et al. | |
| 6,491,226 B1 * | 12/2002 | Nishioka | G06F 1/183 235/475 |
| 6,699,128 B1 * | 3/2004 | Beadell | G07F 17/32 292/106 |
| 6,862,188 B2 * | 3/2005 | Calhoon | H05K 5/0208 340/555 |

(Continued)

FOREIGN PATENT DOCUMENTS

EP 0357308 A3 1/1991

OTHER PUBLICATIONS

Baek et al., "Development of plug and socket-outlet for 400 volts direct current distribution system," 2011 IEEE 8th International Conference on Power Electronics and ECCE Asia (ICPE & ECCE), May 2011, Jeju, South Korea, pp. 218-222.

*Primary Examiner* — Anthony Haughton
*Assistant Examiner* — Ingrid Wright
(74) *Attorney, Agent, or Firm* — VanLeeuwen & VanLeeuwen; Steven L. Bennett

(57) ABSTRACT

An approach is provided in which a system includes a lid detection mechanism that prevents a power supply unit from being electrically coupled to the system when a lid is detached from the system's chassis. According to another embodiment of the present disclosure, the system includes a power supply unit detection mechanism that prevents the lid from being detached from the system's chassis when the power supply unit is electrically coupled to the system.

18 Claims, 9 Drawing Sheets

(56) References Cited

U.S. PATENT DOCUMENTS

| | | |
|---|---|---|
| 7,071,428 B1 | 7/2006 | Bakker |
| 7,554,035 B2 | 6/2009 | Chen |
| 7,654,844 B1* | 2/2010 | Wormsbecher .. H01R 13/62938 |
| | | 361/727 |
| 8,133,064 B2 | 3/2012 | Nishimura |
| 8,454,060 B2 | 6/2013 | Wu et al. |
| 8,816,815 B2 | 8/2014 | Kuramochi et al. |
| 2009/0241607 A1 | 10/2009 | Farrow et al. |
| 2011/0221563 A1 | 9/2011 | Su et al. |
| 2013/0141243 A1* | 6/2013 | Watts ................ H05K 7/20727 |
| | | 340/584 |
| 2016/0163491 A1 | 6/2016 | Neyens et al. |

* cited by examiner

LID AND POWER SUPPLY INTERLOCK MECHANISM

BACKGROUND

The present disclosure relates to a lid and power supply interlock mechanism that requires a removable lid to be attached to a system chassis when a power supply unit is electrically coupled to the system's electrical components.

Industry wide safety specifications require that access to power domains supplied by computer power supplies be limited. A common safety requirement is to prevent operator access to power levels greater than or equal to 240VA (Volts*Amps, or Watts), which is deemed a hazardous energy level. Traditional computer systems may include electrical safety mechanisms, such as momentary switches, to prevent operator access to the hazardous areas. The momentary switches are positioned in proximity to access panels such that the momentary switches are depressed when the access panels are installed, which allows power to pass through the computer system. When an operator removes an access panel, the momentary switch releases and, in turn, disables power to flow through the computer system and reduces the likelihood of electrical shock when the momentary switch functions correctly.

BRIEF SUMMARY

According to one embodiment of the present disclosure, a system includes a lid detection mechanism that prevents a power supply unit from being electrically coupled to the system's electrical contacts when a lid is detached from the system's chassis. In another embodiment of the present disclosure, the system includes a power supply unit detection mechanism that prevents the lid from being detached from the system's chassis when the power supply unit is electrically coupled to the system.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present disclosure, as defined solely by the claims, will become apparent in the non-limiting detailed description set forth below.

BRIEF DESCRIPTION OF THE SEVERAL VIEWS OF THE DRAWINGS

The present disclosure may be better understood, and its numerous objects, features, and advantages made apparent to those skilled in the art by referencing the accompanying drawings, wherein.

DETAILED DESCRIPTION

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions. The following detailed description will generally follow the summary of the disclosure, as set forth above, further explaining and expanding the definitions of the various aspects and embodiments of the disclosure as necessary.

Figure 1:
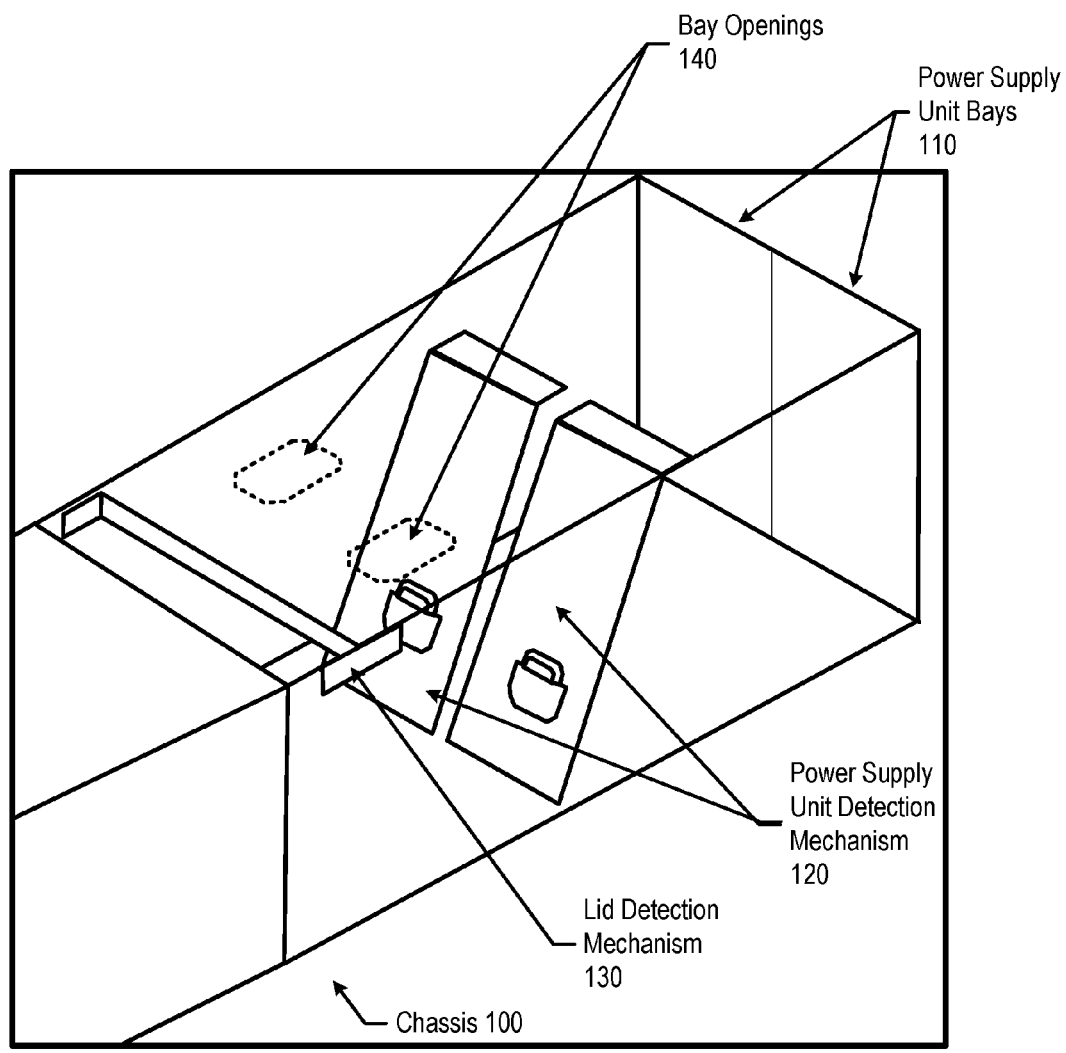
FIG. 1 is an exemplary diagram depicting a system that includes a lid detection mechanism and a power supply unit detection mechanism that prevents a power supply unit from being electrically coupled to a system when a lid is detached from the system.

FIG. 1 is an exemplary diagram depicting a system that includes a lid detection mechanism and a power supply unit detection mechanism that prevents a power supply unit from being electrically coupled to a system when a lid is detached from the system.

This disclosure describes an approach of providing electrical safety within an electronic enclosure via an interlock mechanism. A system includes two mechanisms, which are a lid detection mechanism and a power supply unit detection mechanism. The lid detection mechanism prevents a power supply unit from being electrically coupled to the system when a lid (i.e. access panel) is not attached to the system chassis. Likewise, the power supply unit detection mechanism prevents a lid from being removed from the system chassis when a power supply unit is inserted.

An electronic system, such as a server, a personal computer, a router, etc., includes chassis 100 that houses electronic components such as a processor, memory, electrical contacts, electrical wiring, etc. Chassis 100 includes areas to insert power supply units, such as into power supply unit bays 110. The example in FIG. 1 shows two power supply unit bays, but those skilled in the art can appreciate that chassis 100 may include more or less power supply unit bays, and in different configurations, than what is shown in FIG. 1.

Figure 5:
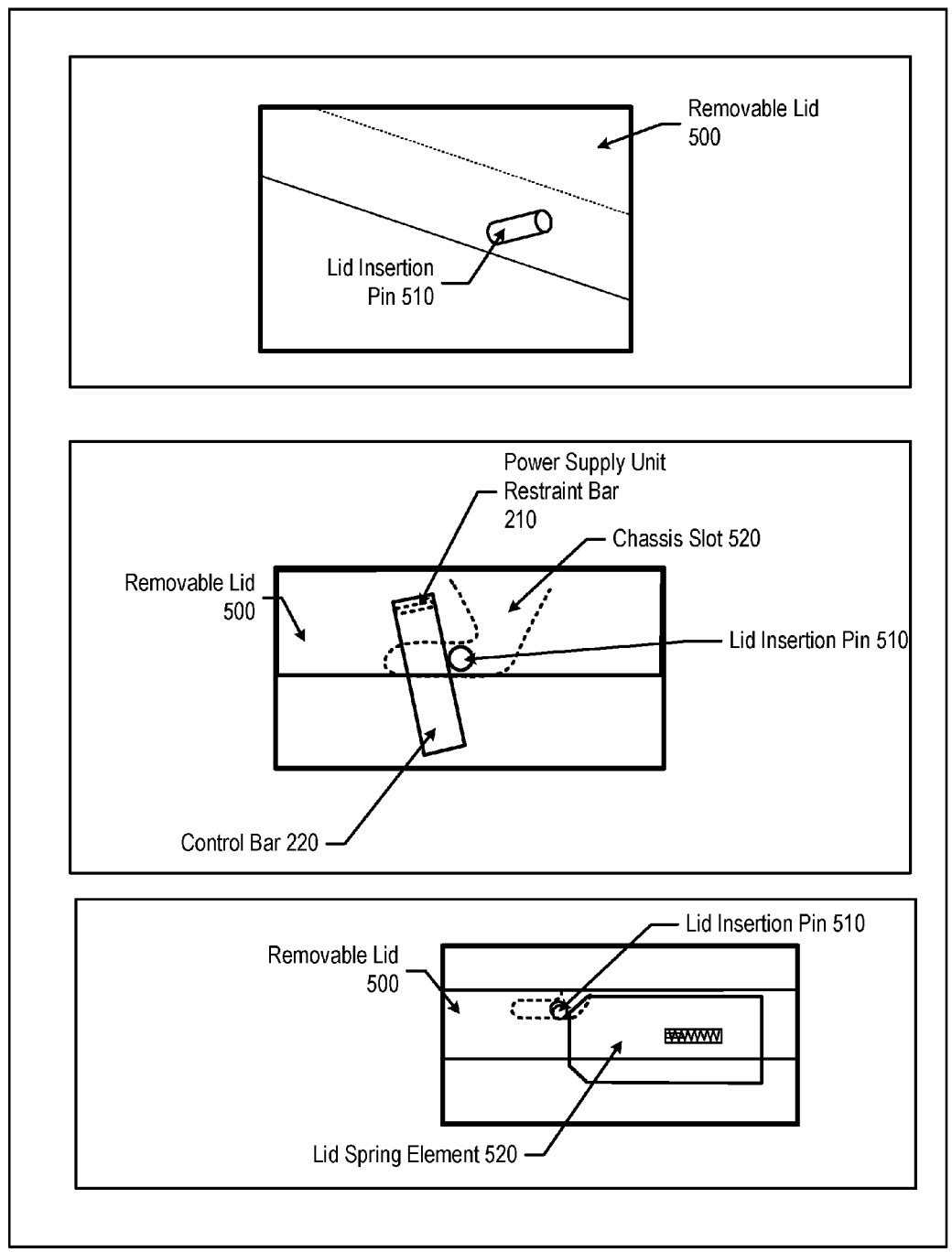
FIG. 5 is an exemplary diagram depicting various components utilized to attach a lid to a chassis and disable a lid detection mechanism.
Figure 6:
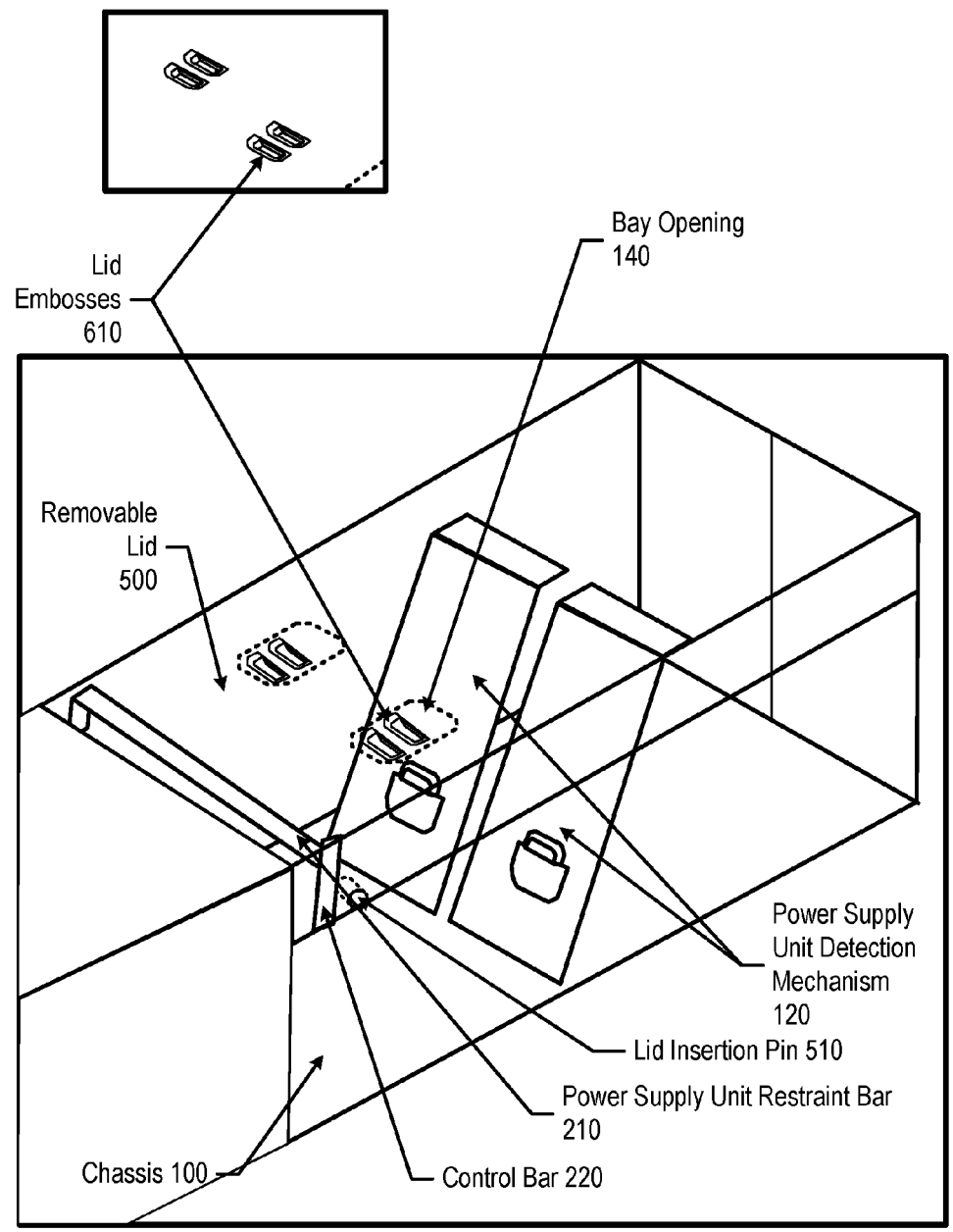
FIG. 6 is an exemplary diagram depicting a removable lid that is attached to a system's chassis.

FIG. 1 shows lid detection mechanism 130 and power supply unit detection mechanism 120. Lid detection mechanism 130 prevents a power supply unit from being fully seated into power supply unit bays 110 when a lid is not attached to chassis 100, therefore preventing the power supply unit from being electrically coupled to electrical components in the system. As shown in FIGS. 5 and 6, an attached lid rotates lid detection mechanism 130 to a disable position that allows a power supply unit to be inserted and electrically coupled to the system.

Figure 7:
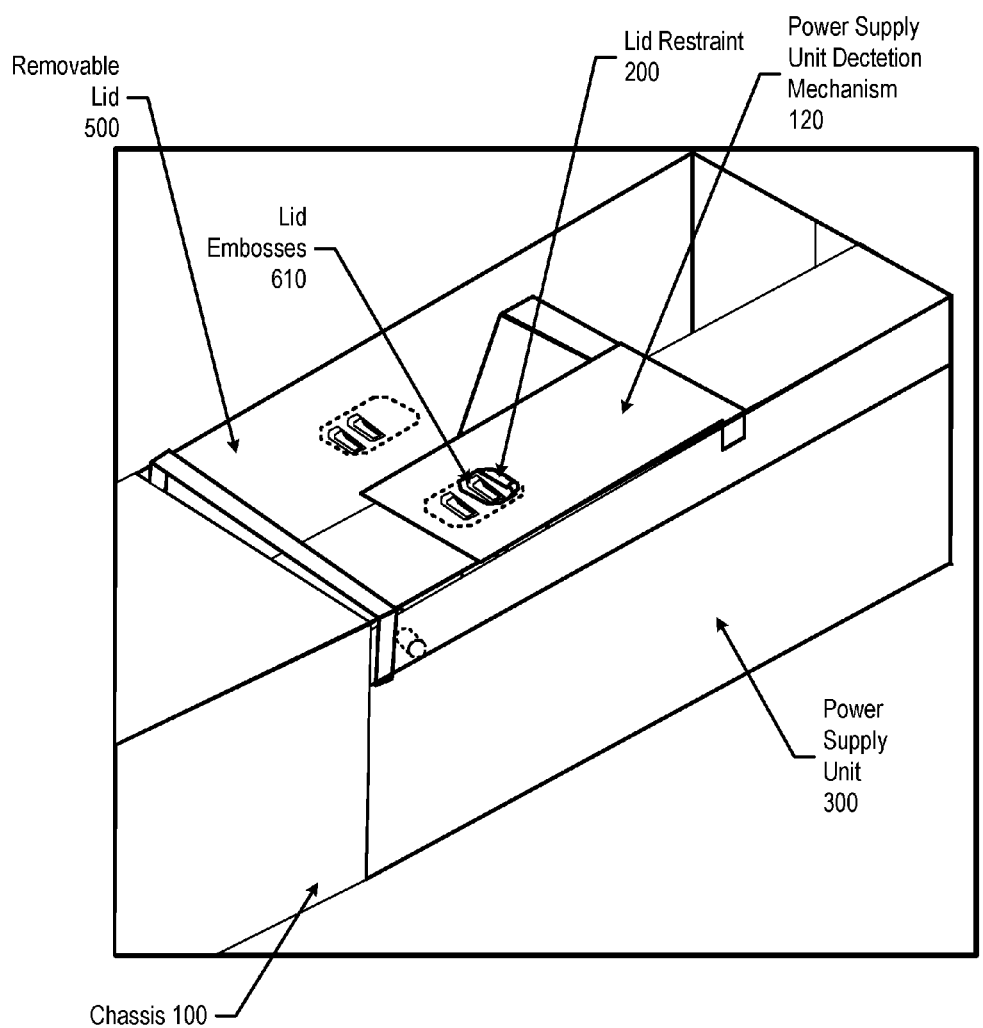
FIG. 7 is an exemplary diagram depicting a system with an attached lid and a power supply unit electrically coupled to the system.

Regarding power supply unit detection mechanism 120, one of power supply unit detection mechanisms 120 rotates into an enabled position (e.g., "upward") when a power supply unit inserts into one of power supply unit bays 110, which causes lid restraints to protrude through bay opening 140 and prevent a lid from being removed. Referring to FIG. 7, lid restraint 200 (e.g., embossed metal) is adjacent to lid embosses 610 and prevents removable lid 500 from sliding "backward" and detaching from chassis 100.

Figure 2:
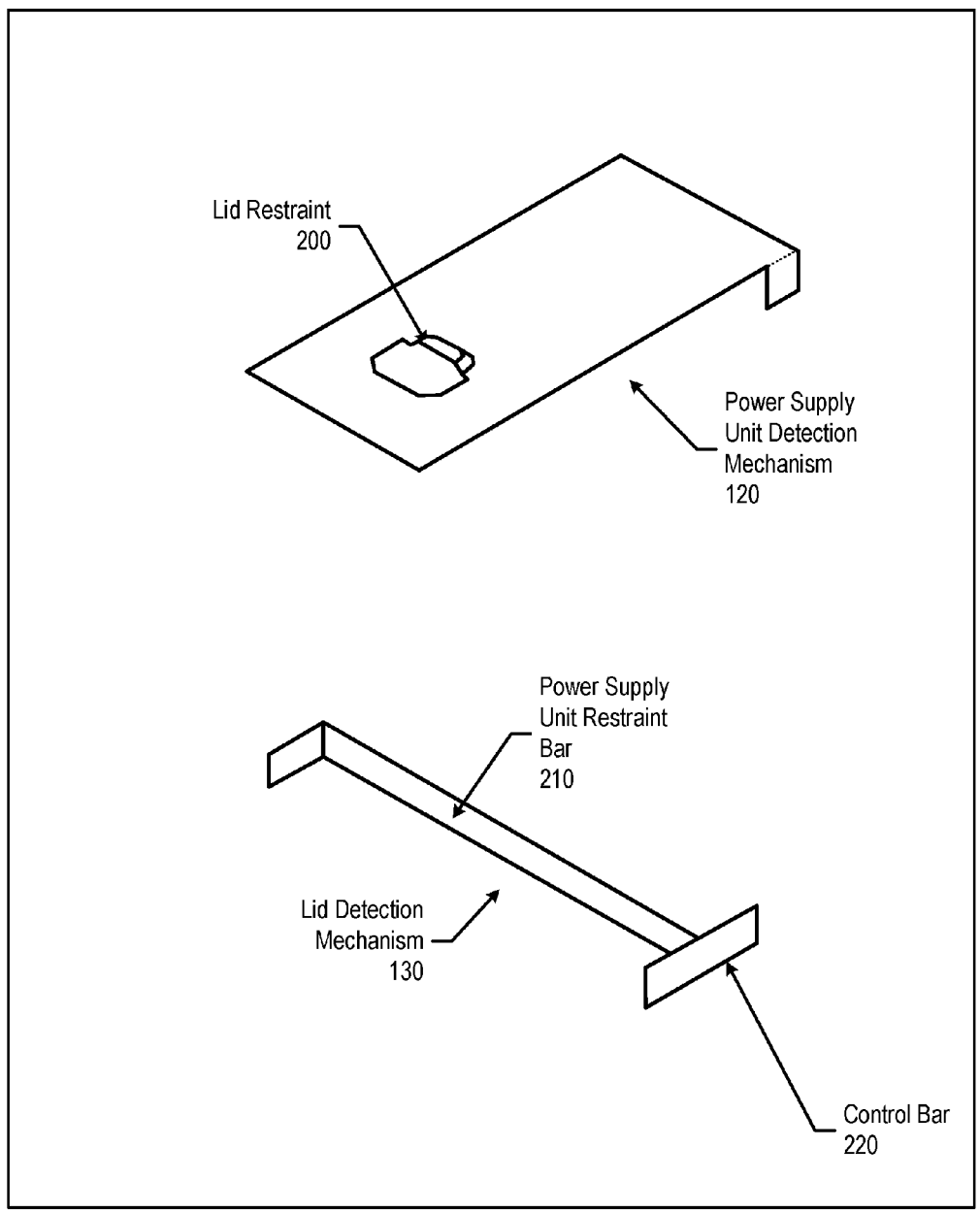
FIG. 2 is an exemplary diagram depicting a power supply detection mechanism and a lid detection mechanism.

FIG. 2 is an exemplary diagram depicting a power supply detection mechanism and a lid detection mechanism. Power supply unit detection mechanism 120 includes lid restraint 200 that, in one embodiment, is a raised portion of metal (embossed) that protrudes through bay opening 140 and prevents a lid from being removed from chassis 100. Referring to FIG. 7, lid restraint 200 prevents lid embosses 610 from sliding forward, thus preventing removable lid 500 from being removed.

Lid detection mechanism 130 includes power supply unit restraint bar 210 and control bar 220. Control bar 220 controls the location of power supply unit restraint 210. When a lid is removed, power supply unit restraint bar 210 is positioned such that a power supply unit is not able to electrically couple to the system's electrical contacts (see FIG. 3, 4, and corresponding text for further details). When a lid attaches to chassis 100, a lid insertion pin on the lid moves control bar 220 into a position that moves power supply unit restraint bar 210 into a disabled position, thus allowing full insertion of the power supply unit and electrically coupling to the system (see FIG. 7 and corresponding text for further details).

Figure 3:
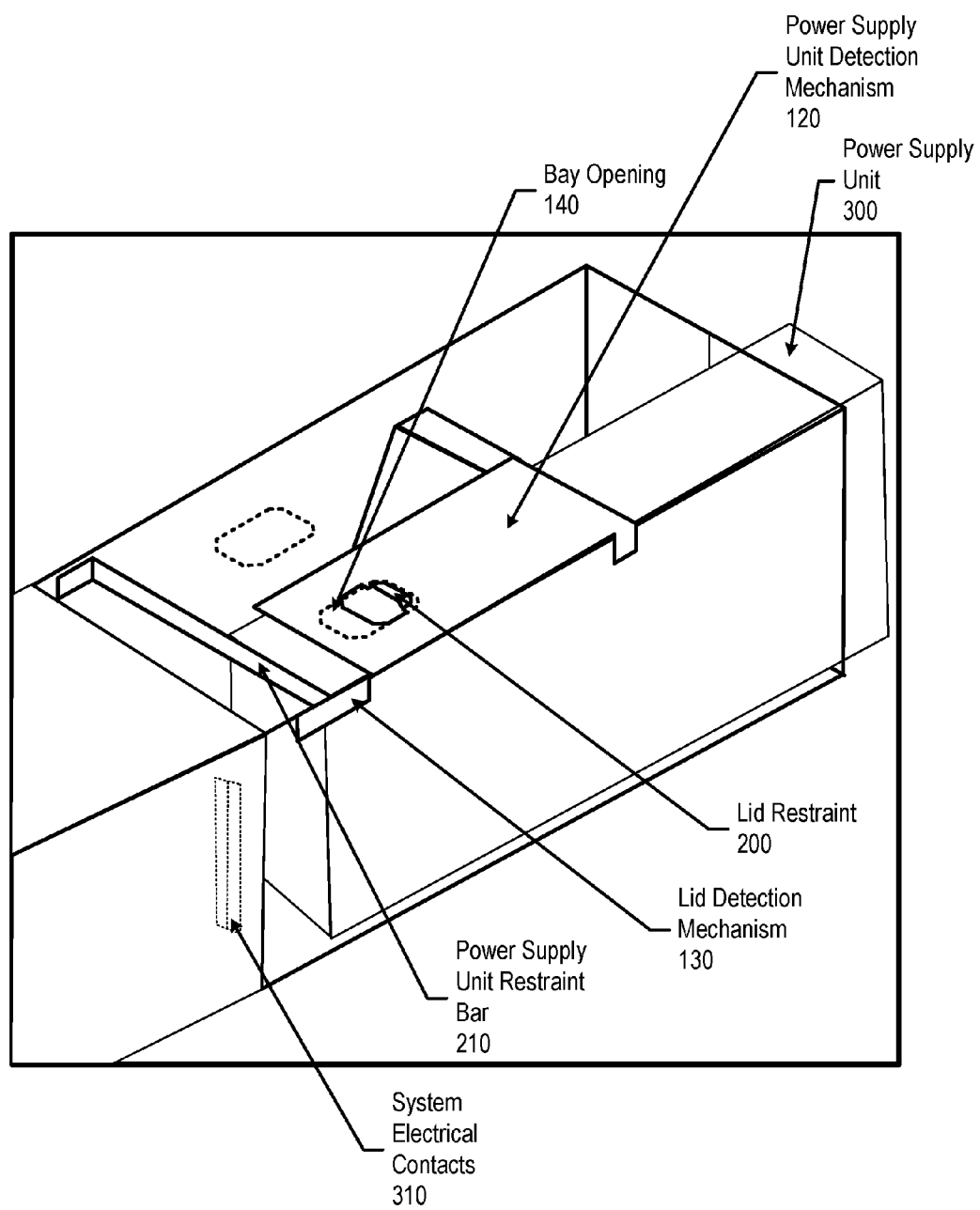
FIG. 3 is an exemplary diagram depicting a lid detection mechanism that prevents a power supply unit from electrically coupling to a system when a lid is detached to the system.

FIG. 3 is an exemplary diagram depicting a lid detection mechanism that prevents a power supply unit from electrically coupling to a system when a lid is not attached to the system. Lid detection mechanism 130 is in a default "enabled" position when a lid is not attached to chassis 100. FIG. 3 shows that power supply unit restraint bar 210 prevents power supply unit 300 from sliding all the way in to chassis 100 and electrically coupling to the system's electrical contacts 310. As such, power is not passed through electrical components 400 within the system (see FIG. 4 and corresponding text for further details).

Figure 4:
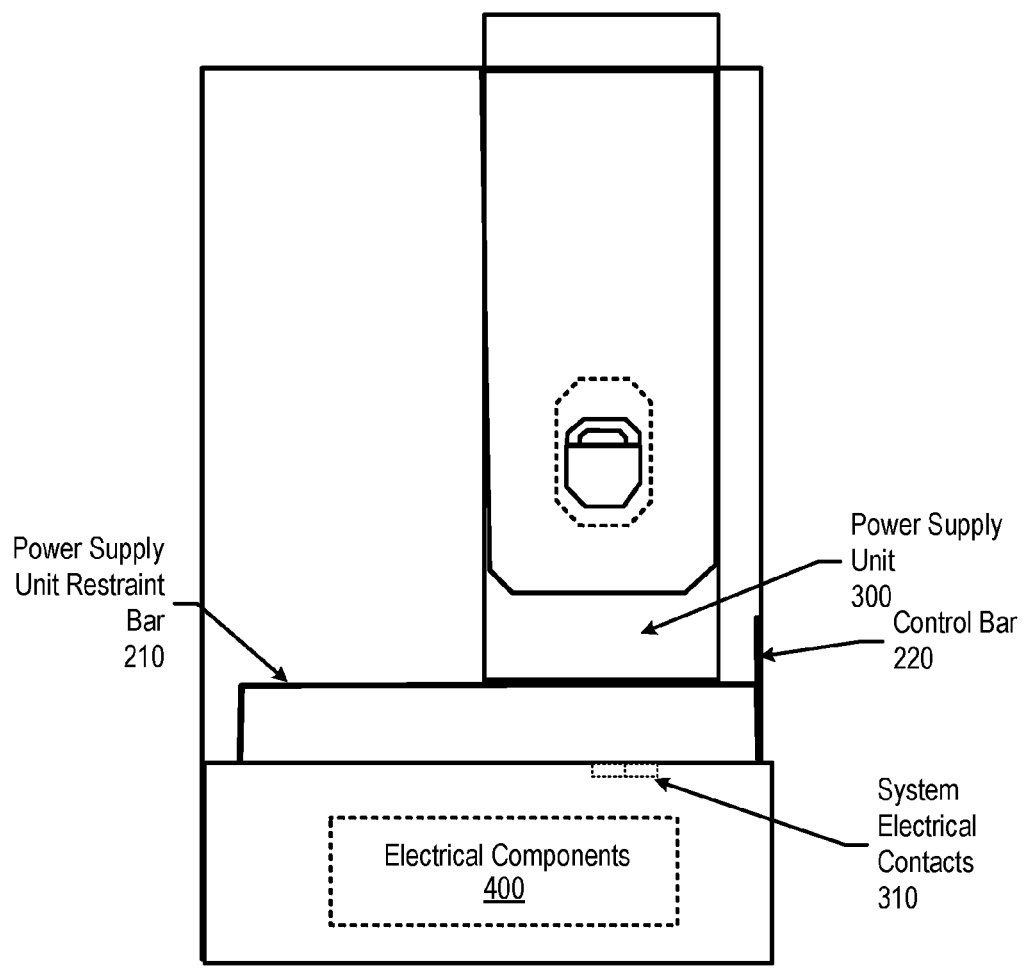
FIG. 4 is an exemplary diagram depicting a top-level view of a lid detection mechanism that prevents a power supply unit from electrically coupling to a system when a lid is detached to the system.

FIG. 4 is an exemplary diagram depicting a top-level view of a lid detection mechanism that prevents a power supply unit from electrically coupling to a system's electrical contacts 310 when a lid is not attached to the system. When a lid is not attached to chassis 100, control bar 200 remains in a default "enabled" position and positions power supply unit restraint bar 210 at a location that prevents power supply unit 300 from fully seating into the system's electrical contacts 310. To move power supply unit restraint bar 210 into a disable position, a lid attaches to chassis 100 and rotates control bar 200 to a disabled position (see FIGS. 5, 6, and corresponding text for further details).

FIG. 5 is an exemplary diagram depicting various components utilized to attach a lid to a chassis and disable a lid detection mechanism.

Removable lid 500 includes lid insertion pin 510, which moves control bar 220 to a disabled position by traveling along chassis slot 520 when removable lid 500 attaches to chassis 100. As can be seen, lid insertion pin 510 moves control bar 220 that, in turn, moves power supply unit restraint bar 210 to a disabled position. In one embodiment, chassis 100 may include lid spring element 520, which applies pressure to lid insertion pin 510 when inserted into chassis slot 520. In this embodiment, lid spring element 520 ensures that removable lid 500 is fully seated on chassis 100.

FIG. 6 is an exemplary diagram depicting a removable lid that is attached to a system's chassis. Removable lid 500 is attached to chassis 100 and, as a result, control bar 220 and power supply unit restraint bar 210 are rotated into a disable position. In turn, a power supply unit may be fully inserted into chassis 100 and electrically couple to the system's electrical components.

FIG. 6 shows lid embosses 610, which are part of removable lid 500 and align with bay opening 140. When a power supply unit is inserted into chassis 100, power supply unit detection mechanism 120 rotates to an enabled position and lid restraint 200 aligns adjacent to lid embosses 610 to prevent removal of removable lid 500 (see FIG. 7 and corresponding text for further details).

FIG. 7 is an exemplary diagram depicting a system with an attached lid and a power supply unit electrically coupled to the system. With removable lid 500 attached to chassis 100 and power supply unit 300 electrically coupled to the system, lid restraint 200 aligns adjacent to lid embosses 610 and prevents removable lid 500 from being removed. As such, to remove removable lid 500 from chassis 100, power supply unit 300 is removed and power supply unit detection mechanism 120 returns to a default position, which allows removable lid 500 to be removed.

Figure 8:
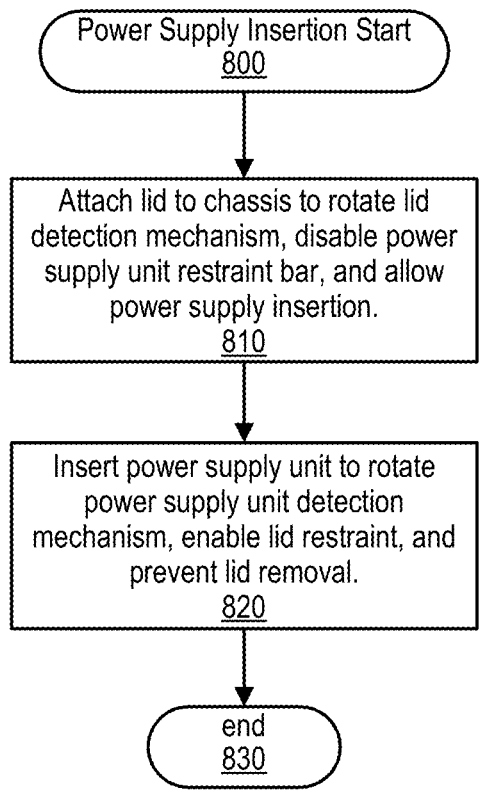
FIG. 8 is an exemplary flowchart depicting steps taken to insert a power supply unit into a system.

FIG. 8 is an exemplary flowchart depicting steps taken to insert a power supply unit into a system. Power supply insertion commences at 800, whereupon a removable lid attaches to the system's chassis at step 810. When the removable lid attaches, a lid insertion pin rotates a lid detection mechanism, which disables the lid detection mechanism from preventing a power supply unit from being inserted. Referring to FIG. 6, when removable lid 500 attaches to chassis 100, lid insertion pin 510 moves control bar 220 to a position that disables power supply unit restraint 210. As such, with the lid attached, a power supply unit may be inserted into chassis 100 and electrically couple to electronic components in the system.

At step 820, the power supply unit is inserted into a power supply unit bay opening, which enables a power supply unit detection mechanism and prevents the lid from being removed. Referring to FIG. 7, power supply unit detection mechanism 120 includes lid restraint 200, which is moved to a position adjacent to lid embosses 610 and prevents removable lid 500 from being removed. At this point, the power supply unit may be turned on to power the system. Power supply insertion steps end at 830.

Figure 9:
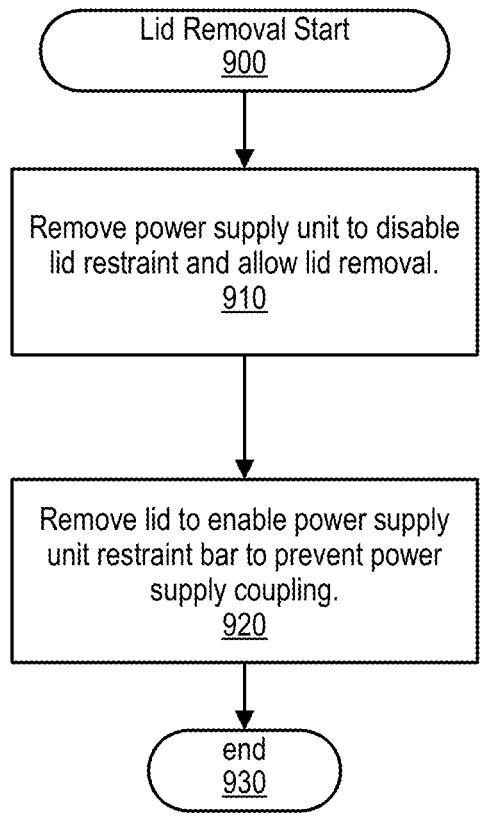
FIG. 9 is an exemplary flowchart depicting steps taken to detach a removable lid from a system chassis.

FIG. 9 is an exemplary flowchart depicting steps taken to detach a removable lid from a system chassis. Lid removal commences at 900, whereupon the power supply unit is removed from the chassis and rotates the power supply unit detection mechanism to a disable position. Referring to FIG. 6, power supply unit detection mechanisms 120 are rotated downward and their corresponding lid restraints are no longer adjacent to lid embosses 610, which allows removable lid 500 to be removed.

The lid is removed at step 920, which enables the power supply unit restraint bar on the power supply unit detection mechanism to prevent a power supply unit from being electrically coupled to the system (refer to FIG. 1 and corresponding text for further details). Lid removal steps end at 930.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; the same holds true for the use in the claims of definite articles.

The invention claimed is:

1. A system comprising:
   a chassis;
   a removable lid that attaches to the chassis;
   one or more electrical contacts adapted to couple to a power supply unit and provide power to one or more electrical components included in the system;
   a lid detection mechanism that prevents the power supply unit from being coupled to at least one of the one or more electrical contacts when the removable lid is detached from the chassis; and
   a lid insertion pin included on the removable lid that adjusts the lid detection mechanism from a default position to an enabled position, wherein the enabled position allows the power supply unit to be inserted into the chassis and electrically couple to at least one of the one or more electrical contacts.

2. The system of claim 1 further comprising:
   a lid spring element coupled to the chassis that places pressure on the lid insertion pin to insert the lid insertion pin into a chassis slot and position the removable lid to a retained position on the chassis.

3. The system of claim 1 further comprising:
   a power supply unit detection mechanism that, when the power supply unit is inserted into the chassis, prohibits the removable lid from being detached from the chassis.

4. The system of claim 3 wherein the power supply unit detection mechanism includes one or more lid restraints that butt against one or more lid embosses on the removable lid that prevent the removal of the removable lid.

5. The system of claim 1 wherein the chassis comprises a plurality of power supply bays to house a plurality of power supply units, and wherein the lid detection mechanism prohibits each of the plurality of power supply units from being electrically coupled to at least one of the one or more electrical contacts when the removable lid is not attached to the chassis.

6. The system of claim 1 wherein the lid detection mechanism comprises a mechanical interlock and is devoid of one or more electrical components.

7. The system of claim 1 wherein the lid detection mechanism prohibits power to reach each one of the one or more electrical components included in the system when the removable lid is detached from the chassis.

8. A system comprising:
   a chassis;
   a removable lid that attaches to the chassis;
   one or more electrical contacts adapted to couple to a power supply unit and provide power to one or more electrical components included in the system; and
   a power supply unit detection mechanism comprising:
      a lid restraint; and
      one or more lid embosses on the removable lid that butt against the lid restraint and prevents the removable lid from being detached from the chassis when the power supply unit is electrically coupled to at least one of the one or more electrical contacts.

9. The system of claim 8 further comprising:
   a lid detection mechanism that prohibits the power supply unit from being electrically coupled to at least one of the one or more electrical contacts when the removable lid is not attached to the chassis.

10. The system of claim 9 wherein the lid detection unit prohibits power to reach each one of the one or more electrical components included in the system when the removable lid is detached from the chassis.

11. The system of claim 9 further comprising:
    a lid insertion pin included on the removable lid that adjusts the removable lid detection mechanism from a default position to an enabled position, wherein the enabled position allows the power supply unit to be inserted into the chassis and electrically coupled to at least one of the one or more electrical contacts.

12. The system of claim 11 further comprising:
    a lid spring element coupled to the chassis that places pressure on the lid insertion pin to insert the lid insertion pin into a chassis slot and position the removable lid to a retained position on the chassis.

13. The system of claim 11 wherein the chassis comprises a plurality of power supply bays to house a plurality of power supply units, and wherein the lid detection mechanism prohibits each of the plurality of power supply units from being electrically coupled to at least one of the one or more electrical contacts when the removable lid is not attached to the chassis.

14. The system of claim 8 wherein the power supply unit detection mechanism comprises a mechanical interlock and is devoid of one or more electrical properties.

15. A system comprising:
   a chassis;
   a removable lid that attaches to the chassis;
   one or more electrical contacts adapted to couple to a power supply unit and provide power to one or more electrical components included in the system;
   a lid detection mechanism that prevents the power supply unit from being coupled to at least one of the one or more electrical contacts when the removable lid is detached from the chassis; and
   a power supply unit detection mechanism comprising one or more lid embosses that butt against one or more lid restraints to prevent the removable lid from being detached from the chassis when the power supply unit is electrically coupled to at least one of the one or more electrical contacts.

16. The system of claim 15 wherein the removable lid further comprises:
   a lid insertion pin that adjusts the removable lid detection mechanism from a default position to an enabled position when the removable lid is attached to the chassis, wherein the enabled position allows the power supply unit to be inserted into the chassis and electrically coupled to at least one of the one or more electrical contacts.

17. The system of claim 16 wherein the chassis further comprises:
   a lid spring element coupled to the chassis, which places pressure on the lid insertion pin to attach the removable lid to the chassis.

18. The system of claim 15 wherein the lid detection mechanism and the power supply unit detection mechanism are both devoid of one or more electrical components.

* * * * *